(12) United States Patent
An

(10) Patent No.: US 11,346,886 B2
(45) Date of Patent: May 31, 2022

(54) BATTERY MANAGEMENT APPARATUS

(71) Applicant: LG Chem, Ltd., Seoul (KR)

(72) Inventor: Yang-Soo An, Daejeon (KR)

(73) Assignee: LG Energy Solution, Ltd.

(*) Notice: Subject to any disclaimer, the term of this patent is extended or adjusted under 35 U.S.C. 154(b) by 0 days.

(21) Appl. No.: 16/965,691

(22) PCT Filed: Sep. 10, 2019

(86) PCT No.: PCT/KR2019/011753
§ 371 (c)(1),
(2) Date: Jul. 29, 2020

(87) PCT Pub. No.: WO2020/055117
PCT Pub. Date: Mar. 19, 2020

(65) Prior Publication Data
US 2020/0355747 A1  Nov. 12, 2020

(30) Foreign Application Priority Data
Sep. 10, 2018 (KR) .................. 10-2018-0107983

(51) Int. Cl.
G01R 31/364 (2019.01)
G01R 31/396 (2019.01)
G01R 31/3835 (2019.01)
G01R 19/00 (2006.01)
H01M 10/42 (2006.01)
(Continued)

(52) U.S. Cl.
CPC ....... *G01R 31/364* (2019.01); *G01R 19/0084* (2013.01); *G01R 31/3835* (2019.01); *G01R 31/396* (2019.01); *H01M 10/425* (2013.01); *H01M 10/482* (2013.01);
(Continued)

(58) Field of Classification Search
CPC ............... G01R 31/364; G01R 31/396; G01R 31/3835; G01R 19/0084; G01R 31/58; G01R 31/54; G01R 19/16542; H01M 50/20; H01M 50/502; H01M 10/425; H01M 10/482; H01M 2010/4271;
(Continued)

(56) References Cited

U.S. PATENT DOCUMENTS 8,513,922 B2  8/2013  Yang et al.
2008/0164880 A1* 7/2008  Jaeger .................. G01R 31/396
   324/426
(Continued)

FOREIGN PATENT DOCUMENTS

CN  103283062 A  9/2013
CN  104836271 A  8/2015
(Continued)

OTHER PUBLICATIONS

Extended European Search Report including Written Opinion for Application No. 19859461.6 dated May 3, 2021, pp. 1-9.
(Continued)

*Primary Examiner* — Daniel R Miller
(74) *Attorney, Agent, or Firm* — Lerner, David, Littenberg, Krumholz & Mentlik, LLP

(57) ABSTRACT

A battery management apparatus for monitoring a state of a bus bar installed to an input and output terminal of a battery pack. A failure of the bus bar installed to the input and output terminal of the battery pack may be suitably diagnosed.

10 Claims, 6 Drawing Sheets

(51) Int. Cl.
*H01M 10/48* (2006.01)
*H01M 50/20* (2021.01)
*H01M 50/502* (2021.01)

(52) U.S. Cl.
CPC ......... *H01M 50/20* (2021.01); *H01M 50/502* (2021.01); *H01M 2010/4271* (2013.01)

(58) Field of Classification Search
CPC ......... H01M 2220/20; H01M 2200/00; H01M 10/48; Y02E 60/10
See application file for complete search history.

(56) References Cited

U.S. PATENT DOCUMENTS

| | | | | |
|---|---|---|---|---|
| 2009/0079418 A1* | 3/2009 | Stegen | ................. | G01R 31/396 324/114 |
| 2012/0112785 A1 | 5/2012 | Mizoguchi | | |
| 2012/0139548 A1 | 6/2012 | Yang et al. | | |
| 2012/0280692 A1 | 11/2012 | Park | | |
| 2015/0077124 A1* | 3/2015 | Suzuki | ................. | H02J 7/0021 324/426 |
| 2015/0229144 A1 | 8/2015 | Jang et al. | | |
| 2017/0365885 A1 | 12/2017 | Shin | | |
| 2019/0302186 A1* | 10/2019 | Fifield | ................ | G01R 31/3835 |
| 2020/0014005 A1 | 1/2020 | Lee et al. | | |

FOREIGN PATENT DOCUMENTS

| | | | |
|---|---|---|---|
| CN | 107003363 | A | 8/2017 |
| JP | 2014117068 | A | 6/2014 |
| JP | 2015069964 | A | 4/2015 |
| JP | 5732570 | B2 | 6/2015 |
| KR | 101182923 | B1 | 9/2012 |
| KR | 20130137389 | A | 12/2013 |
| KR | 20140055065 | A | 5/2014 |
| KR | 20160068522 | A | 6/2016 |
| KR | 101749731 | B1 | 7/2017 |
| KR | 101856067 | B1 | 5/2018 |
| KR | 20180099440 | A | 9/2018 |

OTHER PUBLICATIONS

International Search Report for Application No. PCT/KR2019/011753 dated Jan. 2, 2020, 2 pages.
Search Report dated Jan. 7, 2022 from the Office Action for Chinese Application No. 201980009521.4 issued Jan. 18, 2022, 3 pages.

* cited by examiner

BATTERY MANAGEMENT APPARATUS

CROSS-REFERENCE TO RELATED APPLICATIONS

The present application is a national phase entry under 35 U.S.C. § 371 of International Application No. PCT/KR2019/011753 filed Sep. 10, 2019, published in Korean, which claims priority from Korean Patent Application No. 10-2018-0107983 filed Sep. 10, 2018, all of which are incorporated herein by reference.

TECHNICAL FIELD

The present disclosure relates to a battery management apparatus, and more particularly, to a battery management apparatus for monitoring a state of a bus bar installed to an input and output terminal of a battery pack.

BACKGROUND ART

Recently, as the demand for portable electronic products such as laptops, video cameras, mobile phones, and the like is rapidly increased and the development of electric vehicles, storage batteries for energy storage, robots, satellites, and the like is in earnest, high-performance batteries capable of repeatedly charging and discharging is actively studied.

Batteries currently commercialized include nickel cadmium batteries, nickel hydride batteries, nickel zinc batteries, and lithium batteries. Among them, the lithium batteries have almost no memory effect compared to nickel-based batteries, to freely charge and discharge, and have a very low high self-discharge rate and a high energy density. Thus, lithium batteries have attracted much attention.

Recently, in order to provide a high voltage, the demand for a battery pack including two or more battery modules connected in series through a bus bar and having bus bars installed at input and output terminals for charging and discharging has increased. One end of the bus bar installed between the battery modules is connected to a positive electrode terminal of one battery module and the other end of the bus bar is connected to a negative electrode terminal of the other battery module, thus providing a current path through the two battery modules. In addition, one of the bus bars installed to the input and output terminals of the battery pack is connected to a positive electrode terminal of the battery module having the highest potential, and the other bus bar is connected to a negative electrode terminal of the battery module having the lowest potential.

However, due to an external shock or aging of the bus bar itself, the connection state between the bus bar and the battery module may become worse. For example, if a crack occurs in the bus bar or the contact area between one end of the bus bar and the terminal of the battery module decreases, the resistance of the current path between the two battery modules may increase, causing serious heat generation. In a severe case, the two battery modules may be completely electrically disconnected.

Accordingly, there is an increasing need for a technique of properly diagnosing a failure of the bus bar that that provides a current path between two battery modules and to the input and output terminal of the battery pack.

To this end, the conventional bus bar diagnosis device electrically connects the bus bar to measurement channels of a voltage measurement unit to measure a voltage of the bus bar and diagnoses a failure of the bus bar using the measured voltage of the bus bar.

In this case, some of the measurement channels of the voltage measurement unit for measuring a voltage of each of a plurality of battery modules, a voltage of a plurality of battery cells included in each of the battery modules, or the like should be used for measuring the voltage of the bus bar.

Accordingly, the conventional bus bar diagnosis device must include a plurality of voltage measurement units to increase the number of measurement channels in order to measure the voltages of the plurality of battery modules and the plurality of battery cells and further measure the voltage of the bus bar.

SUMMARY

Technical Problem

The present disclosure is designed to solve the problems of the related art, and therefore the present disclosure is directed to providing a battery management apparatus capable of measuring a voltage of a bus bar installed to an input and output terminal of a battery pack by using a measurement channel of a voltage measurement unit for measuring a cell voltage of a battery cell.

In addition, the present disclosure is directed to providing a battery management apparatus capable of diagnosing a failure of the bus bar based on the voltage of the bus bar and the cell voltage of the battery cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for accomplishing the above objects are as follows.

A battery management apparatus according to the present disclosure monitors a state of a bus bar electrically connected to an input and output terminal of a battery pack including at least one battery module.

The battery management apparatus comprises: a voltage measurement unit having a plurality of measurement channels respectively electrically connected to corresponding electrode terminals of a plurality of battery cells included in the battery module and configured to measure respective voltages applied to the plurality of measurement channels; a measurement target changing unit having a first measurement line for electrically connecting a positive electrode terminal of a first battery cell among the plurality of battery cells to a first measurement channel among the plurality of measurement channels, a second measurement line, and a first switching element positioned on the second measurement line and having a closed state in which the second measurement line electrically connects the bus bar to the first measurement channel and an open state in which the bus bar and the first measurement channel are electrically disconnected; and a processor configured to control an operation state of the first switching element between the closed state and the open state and calculate a bus bar voltage applied to the bus bar based on a first voltage applied to the first measurement channel and a second voltage applied to a measurement channel other than the first measurement channel.

The processor may calculate the bus bar voltage while the first switching element is in the closed state.

While the first switching element is in the closed state, the processor may calculate a cell voltage of a battery cell other than the first battery cell based on the second voltage, calculate a first voltage difference between the first voltage and a third voltage applied to a second measurement channel that is electrically connected to a negative electrode terminal of the first battery cell, and calculate the bus bar voltage based on the first voltage difference and the cell voltage.

The processor may calculate a second bus bar voltage based on a second voltage difference between the first voltage and a third voltage applied to the first measurement channel while the first switching element is in the open state.

The processor may control the operation state of the first switching element to the open state in response to receipt of a cell voltage measurement request signal requesting to measure a cell voltage of each of the plurality of battery cells.

While the first switching element is controlled in the open state, the processor may calculate a cell voltage of the first battery cell from a first voltage difference between the first voltage applied and a third voltage applied to a second measurement channel that is electrically connected to a negative electrode terminal of the first battery cell.

The battery management apparatus may further comprise a current measurement unit configured to measure a pack current flowing at the input and output terminal of the battery pack.

The measurement target changing unit may include a second switching element positioned on the first measurement line and configured to electrically connect and disconnect the positive electrode terminal of the first battery cell and the first measurement channel.

The processor may diagnose whether a failure occurs at the bus bar based on the pack current and the bus bar voltage and control an operation state of at least one of the first switching element or the second switching element based on the diagnosing result.

When it is diagnosed that a failure occurs at the bus bar, the processor may control the first switching element to be in the open state, and the second switching element to disconnect the positive electrode terminal of the first battery cell from the first measurement channel.

A battery pack according to the present disclosure comprises the battery management apparatus according to any of the embodiments described herein.

A vehicle according to the present disclosure comprises the battery management apparatus according to any of the embodiments described herein.

Advantageous Effects

According to at least one of the embodiments of the present disclosure, since a voltage of a bus bar installed to an input and output terminal of a battery pack is measured using a measurement channel of a voltage measurement unit for measuring a cell voltage of a battery cell, it is possible to decrease the number of measurement channels that must be provided in the voltage measurement unit.

In addition, according to at least one of the embodiments of the present disclosure, it is possible to suitably diagnose a failure of the bus bar installed to the input and output terminal of the battery pack.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in describing the present disclosure, if it is determined that detailed description of a related configuration or function may obscure the gist of the present disclosure, the detailed description will be omitted.

Terms including ordinal numbers, such as first and second, are used for the purpose of distinguishing any one of various components from the others, and are not used to limit the components by the terms.

Throughout the specification, when a part "includes" a certain component, it means that the part may further include other components, without excluding other components, unless otherwise stated.

In addition, throughout the specification, when a part is "connected" to another part, this includes not only the case where these parts are "directly connected" but also the case where these parts are "indirectly connected" with another element being interposed therebetween.

Figure 1:
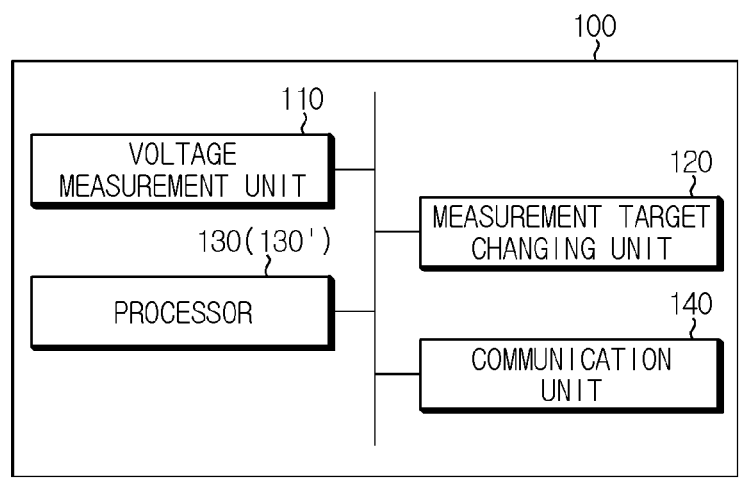
FIG. 1 is a block diagram showing a functional configuration of a battery management apparatus according to an embodiment of the present disclosure.
Figure 2:
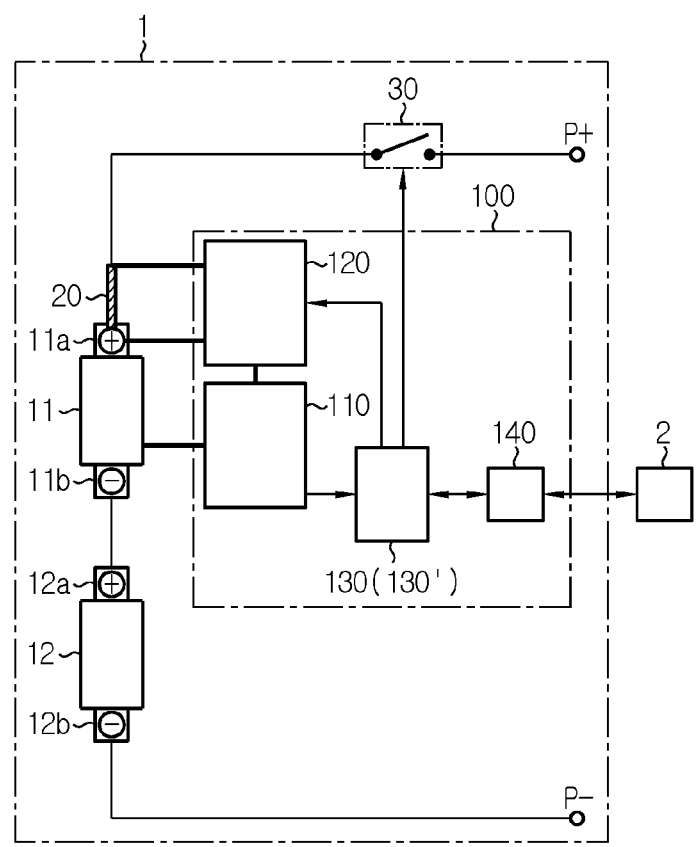
FIG. 2 is a circuit diagram showing a functional configuration of a battery pack including the battery management apparatus according to an embodiment of the present disclosure.
Figure 3:
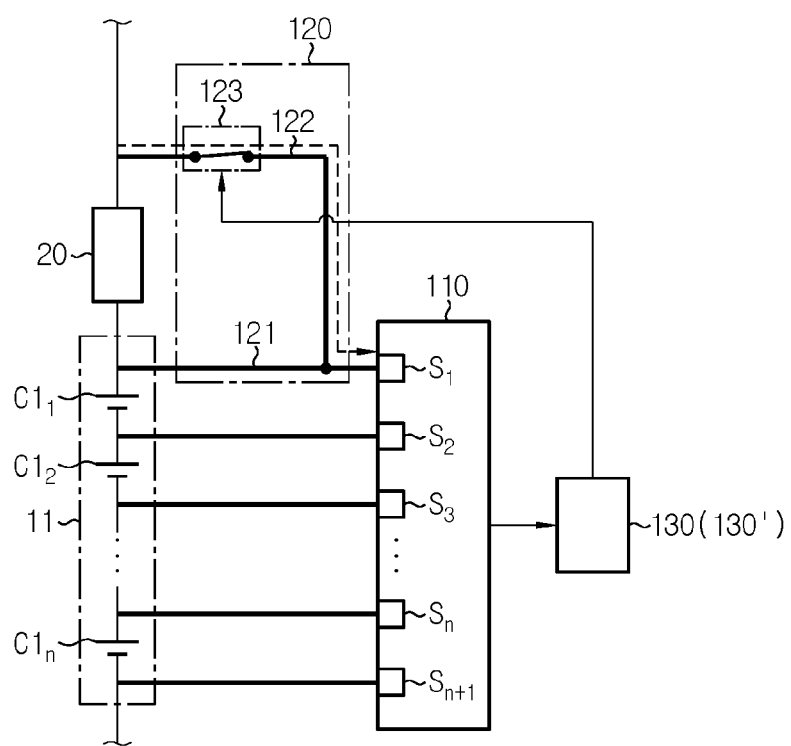
FIGS. 3 and 4 are circuit diagrams showing a current path according to an operation state of a first switching element.
Figure 4:
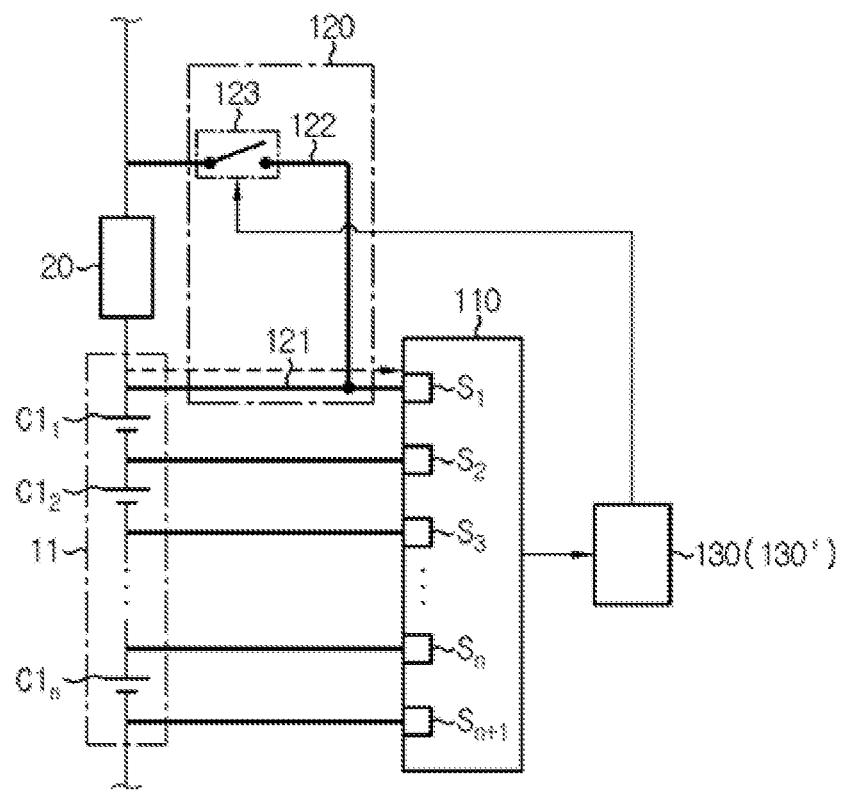

FIG. 1 is a block diagram showing a functional configuration of a battery management apparatus 100 according to an embodiment of the present disclosure, FIG. 2 is a circuit diagram showing a functional configuration of a battery pack 1 including the battery management apparatus 100 according to an embodiment of the present disclosure, and FIGS. 3 and 4 are circuit diagrams showing a current path according to an operation state of a first switching element 123.

Referring to FIGS. 1 to 4, the battery pack 1 includes a first input and output terminal P+, a second input and output terminal P−, a first battery module 11, a second battery module 12, a bus bar 20, a contactor 30 and a battery management apparatus 100.

The first battery module 11 includes a plurality of battery cells $C1_1, \ldots, C1_n$. The second battery module 12 includes a plurality of battery cells $C2_1, \ldots, C2_n$. The first battery module 11 includes a positive electrode terminal 11a and a negative electrode terminal 11b. The second battery module 12 includes a positive electrode terminal 12a and a negative electrode terminal 12b.

Even though it is described that the battery pack 1 according to an embodiment of the present disclosure includes two battery modules, a battery pack according to another embodiment may include at least one battery module. That is, the battery pack according to another embodiment may include one battery module or three or more battery modules.

The bus bar 20 is installed at a high potential side or a low potential side of the battery pack 1. The bus bar 20 is electrically connected to the first input and output terminal P+ or the second input and output terminal P− of the battery pack 1. Here, the high potential side may be a high current path between the positive electrode terminal 11a of the first battery module 11 and the first input and output terminal P+, and the low potential side may be a high current path between the negative electrode terminal 12b of the second battery module 12 and the second input and output terminal P−.

In addition, the bus bar 20 may be electrically connected to a contactor 30, explained later.

For example, the bus bar 20 may be electrically connected to the contactor 30 installed at the high potential side of the battery pack 1.

That is, the bus bar 20 may have one end electrically connected to the positive electrode terminal 11a of the first battery module 11 and the other end electrically connected to the contactor 30.

The contactor 30 is installed at the high potential side or the low potential side of the battery pack 1. An operation state of the contactor 30 is controlled into a turn-on state or a turn-off state according to a switching signal from a processor 130 of the battery management apparatus 100, explained later.

While the contactor 30 is in the turn-on state, a pack current may flow through the high current path of the battery pack 1. Meanwhile, while the contactor 30 is in the turn-off state, the flow of the pack current through the high current path of the battery pack 1 is interrupted.

The battery management apparatus 100 includes a voltage measurement unit 110, a measurement target changing unit 120 and a processor 130. The battery management apparatus 100 may further include a communication unit 140.

The voltage measurement unit 110 is implemented using ASICs (application specific integrated circuits) or the like.

The voltage measurement unit 110 includes a plurality of measurement channels $S_1, \ldots, S_{n+1}$ respectively electrically connected to the plurality of battery cells $C1_1, \ldots, C1_n$ included in the first battery module 11 and measures voltages applied to the plurality of measurement channels $S_1, \ldots, S_{n+1}$ from the plurality of battery cells $C1_1, \ldots, C1_n$, respectively.

For this, the voltage measurement unit 110 may further include at least one voltage sensor (not shown).

The plurality of measurement channels $S_1, \ldots, S_{n+1}$ may be electrically connected to the plurality of battery cells $C1_1, \ldots, C1_n$ provided in the first battery module 11, respectively. More specifically, among the plurality of measurement channels $S_1, \ldots, S_{n+1}$, the first measurement channel $S_1$ is electrically connected to a positive electrode terminal of a battery cell "$C1_1$" located at the high potential side among the plurality of battery cells $C1_1, C1_n$. Among the plurality of measurement channels $S_1, \ldots, S_{n+1}$, the second to $n^{th}$ measurement channels $S_2, \ldots, S_n$ are electrically connected between the battery cells "$C1_2$" to "$C1_n$", respectively. Among the plurality of measurement channels $S_1, \ldots, S_{n+1}$, the $n+1^{th}$ measurement channel $S_{n+1}$ is electrically connected to a negative electrode terminal of the battery cell "$C1_n$" located at the low potential side among the plurality of battery cells $C1_1, \ldots, C1_n$.

For example, if the first battery module 11 includes two battery cells $C1_1, \ldots, C1_2$, the voltage measurement unit 110 may include three measurement channels $S_1, S_2, S_3$. At this time, among the three measurement channels $S_1, S_2, S_3$, the first measurement channel $S_1$ is electrically connected to a positive electrode terminal of the battery cell "$C1_1$" located at the high potential side among the two battery cells $C1_1, C1_2$. Among the three measurement channels $S_1, S_2, S_3$, the second measurement channel $S_2$ is electrically connected between the battery cell "$C1_1$" and the battery cell "$C1_2$". Among the three measurement channels $S_1, S_2, S_3$, the third measurement channel $S_3$ is electrically connected to a negative electrode terminal of the battery cell "$C1_2$" located at the low potential side among the two battery cells $C1_1, C1_2$.

Accordingly, a voltage obtained by composing the cell voltages of the plurality of battery cells $C1_1, \ldots, C1_n$ may be applied to the first measurement channel $S_1$.

The voltage measurement unit 110 may output a signal indicating the voltage applied to each of the plurality of measurement channels $S_1, \ldots, S_{n+1}$ to the processor 130.

The measurement target changing unit 120 includes a first measurement line 121, a second measurement line 122 and a first switching element 123.

The first measurement line 121 electrically connects the positive electrode terminal of the first battery cell $C1_1$ among the plurality of battery cells $C1_1, \ldots, C1_n$ to the first measurement channel $S_1$ among the plurality of measurement channels $S_1, \ldots, S_{n+1}$. For this, one end of the first measurement line 121 is electrically connected to the positive electrode terminal 11a of the first battery module 11 and thus electrically connected to the positive electrode terminal of the first battery cell $C1_1$. In addition, one end of the first measurement line 121 is electrically connected to one end of the bus bar 20. The other end of the first measurement line 121 is electrically connected to the first measurement channel $S_1$.

The second measurement line 122 electrically connects the bus bar 20 to the first measurement channel $S_1$. For this, one end of the second measurement line 122 is electrically connected to the other end of the bus bar 20. The other end of the second measurement line 122 is electrically connected to the first measurement channel $S_1$.

The first switching element 123 electrically connects or disconnects the second measurement line 122. Specifically, the first switching element 123 is installed at the second measurement line 122. The operation state of the first switching element 123 is controlled into a turn-on state or a turn-off state according to the switching signal from the processor 130 of the battery management apparatus 100, explained later.

While the first switching element 123 is in the turn-on state, a current does not flow through the first measurement line 121 but a current flows through the second measurement line 122, so that the voltage applied to the other end of the bus bar 20 is applied to the first measurement channel $S_1$.

On the contrary, while the first switching element 123 is in the turn-off state, a current is interrupted to the second measurement line 122 and a current flows through the first measurement line 121, so that the voltage of the positive electrode terminal of the first battery cell $C1_1$ is applied to the first measurement channel $S_1$. Here, while the first switching element 123 is in the turn-off state, the voltage applied to the first measurement channel $S_1$ may be the voltage of the positive electrode terminal 11a of the first battery module 11, which is equal to the voltage applied to the positive electrode terminal of the first battery cell $C1_1$.

The processor 130 is operably coupled to the voltage measurement unit 110 and the measurement target changing unit 120. The processor 130 may also be operably coupled to the contactor 30 and the communication unit 140.

If a cell voltage measurement request signal requesting to measure a cell voltage of each of the plurality of battery cells $C1_1, \ldots, C1_n$ is received, the processor 130 controls the operation state of the first switching element 123 into a turn-off state.

After that, the processor 130 calculates a voltage difference between voltages applied to neighboring measurement channel among the plurality of measurement channels $S_1, \ldots, S_{n+1}$ as the cell voltage of each of the plurality of battery cells $C1_1, \ldots C1_n$. Specifically, the processor 130 calculates a voltage difference of the voltages respectively applied to the $n^{th}$ measurement channel $S_n$ and the $n+1^{th}$ measurement channel $S_{n+1}$ as the cell voltage of the $n^{th}$ battery cell $C1_n$. Here, n may be a constant of 1 or above. For example, the processor 130 calculates a voltage difference of the voltages respectively applied to the second measurement channel $S_2$ and the third measurement channel $S_3$ as the cell voltage of the second battery cell $C1_2$.

At this time, the processor 130 controls the operation state of the first switching element 123 in order to calculate the cell voltage of the first battery cell $C1_1$. Specifically, the processor 130 controls the operation state of the first switching element 123 into a turn-off state and calculates a voltage difference of the voltages respectively applied to the first measurement channel $S_1$ and the second measurement channel $S_2$ as the cell voltage of the first battery cell $C1_1$.

Meanwhile, a bus bar voltage measurement request signal requesting to measure a bus bar voltage of the bus bar 20 is received, the processor 130 controls the operation state of the first switching element 123 into a turn-off state or a turn-on state.

The processor 130 controls the operation state of the first switching element 123 and calculates the bus bar voltage applied to the bus bar 20 based on the voltage applied to the first measurement channel $S_1$ and the voltage applied to measurement channels $S_2, \ldots, S_{n+1}$ other than the first measurement channel $S_1$ among the plurality of measurement channels $S_1, \ldots, S_{n+1}$. Here, the bus bar voltage may be a voltage applied between one end and the other end of the bus bar 20.

The processor 130 calculates the bus bar voltage after controlling the operation state of the first switching element 123 into a turn-on state.

Specifically, after the operation state of the first switching element 123 is controlled into a turn-on state, the processor 130 calculates the cell voltage of each of battery cells $C1_2, \ldots, C1_n$ other than the first battery cell $C1_1$ among the plurality of battery cells $C1_1, \ldots, C1_n$ based on the voltage applied to measurement channels $S_2, \ldots, S_{n+1}$ other than the first measurement channel $S_1$.

After that, in a state where the operation state of the first switching element 123 is controlled into a turn-on state, the processor 130 calculates a first voltage difference between the voltage applied to the first measurement channel $S_1$ and the voltage applied to the second measurement channel $S_2$ electrically connected to the negative electrode terminal of the first battery cell $C1_1$.

Next, the processor 130 calculates a bus bar voltage by using the calculated first voltage difference and the cell voltage.

At this time, the processor 130 calculates a cell voltage average of the cell voltages of the battery cells $C1_2, \ldots, C1_n$ other than the first battery cell $C1_1$, and calculates a voltage difference between the first voltage difference and the cell voltage average as the bus bar voltage.

If the processor 130 controls the first switching element 123 into a turn-on state, as shown in FIG. 3, a voltage obtained by composing the cell voltage of each of all battery cells $C1_1, \ldots, C1_n$ and the bus bar voltage applied to the bus bar 20 is applied to the first measurement channel $S_1$, and a voltage obtained by composing the cell voltages of the battery cells $C1_2, \ldots, C1_n$ other than the first battery cell $C1_1$ is applied to the second measurement channel $S_2$. Accordingly, in a state where the operation state of the first switching element 123 is controlled into a turn-on state, the first voltage difference calculated by the processor 130 may be a voltage obtained by composing the cell voltage of the first battery cell $C1_1$ and the bus bar voltage.

Meanwhile, since the cell voltages of the plurality of battery cells $C1_1, \ldots C1_n$ included in the same battery module have a predetermined voltage difference, the cell voltage average of the cell voltages of the battery cells $C1_2, \ldots, C1_n$ other than the first battery cell $C1_1$ may be estimated as the cell voltage of the first battery cell $C1_1$.

By using this, the processor 130 calculates a voltage difference between the first voltage difference and the cell voltage average as the bus bar voltage.

A battery management apparatus according to another embodiment of the present disclosure may be different from the battery management apparatus 100 according to an embodiment of the present disclosure only in the process where a processor 130' calculates a bus bar voltage.

Specifically, the processor 130' according to another embodiment may calculate a bus bar voltage by using the second voltage difference between the voltage applied to the first measurement channel $S_1$ after the operation state of the first switching element 123 is controlled into a turn-on state and the voltage applied to the first measurement channel $S_1$ before the operation state of the first switching element 123 is controlled into a turn-on state.

Specifically, if a bus bar voltage measurement request signal is received, the processor 130' according to another embodiment stores the voltage applied to the first measurement channel $S_1$ before the operation state of the first switching element 123 is controlled into a turn-on state. That is, the processor 130' according to another embodiment stores the voltage applied to the first measurement channel $S_1$ when the operation state of the first switching element 123 is a turn-off state.

After that, the processor 130' according to another embodiment controls the operation state of the first switching element 123 into a turn-on state and stores the voltage applied to the first measurement channel $S_1$ when the operation state of the first switching element 123 is a turn-on state.

As described above, if the processor 130' controls the first switching element 123 into a turn-on state, as shown in FIG. 3, a voltage obtained by composing the cell voltage of each of all battery cells $C1_1, \ldots, C1_n$ and the bus bar voltage applied to the bus bar 20 is applied to the first measurement channel S On the contrary, if the processor 130' controls the first switching element 123 into a turn-off state, as shown in FIG. 4, a voltage obtained by composing only the cell voltages of all battery cells $C1_1, \ldots, C1_n$ is applied to the first measurement channel $S_1$.

By using this, the processor 130' according to another embodiment may calculates the second voltage difference between the voltage applied to the first measurement channel S after the operation state of the first switching element 123 is controlled into a turn-on state and the voltage applied to the first measurement channel $S_1$ before the operation state of the first switching element 123 is controlled into a turn-on state as the bus bar voltage.

According to the present disclosure, by using any one measurement channel among the measurement channels of the voltage measurement unit 110 for measuring the cell voltage of each of the plurality of battery cells included in the battery module, it is possible to measure the bus bar voltage by utilizing the voltage measurement unit 110 having a limited number of measurement channels.

The processor 130, 130' may be is implemented in hardware by using at least one of application specific integrated circuits (ASICs), digital signal processors (DSPs), digital signal processing devices (DSPDs), programmable logic devices (PLDs), field programmable gate arrays (FPGAs), microcontrollers, and electrical units for performing other functions. The processor 130, 130' may have a built-in memory. In the memory, a program for executing a method explained later and various data may be stored. The memory may include, for example, at least type of storage media selected from a flash memory type, a hard disk type, a solid state disk (SSD) type, a silicon disk drive type, a multimedia card micro type, a random access memory (RAM), a static random access memory (SRAM), a read-only memory (ROM), an electrically erasable programmable read-only memory (EEPROM), and a programmable read-only memory (PROM).

The communication unit 140 is configured to support bidirectional communication between the processor 130 and an external device 2. The communication unit 140 may transmit a message indicating the bus bar voltage calculated by the processor 130 to the external device 2. The communication unit 140 may transmit a command from the external device 2 to the processor 130.

Hereinafter, a battery management apparatus 100" according to still another embodiment will be described.

Figure 5:
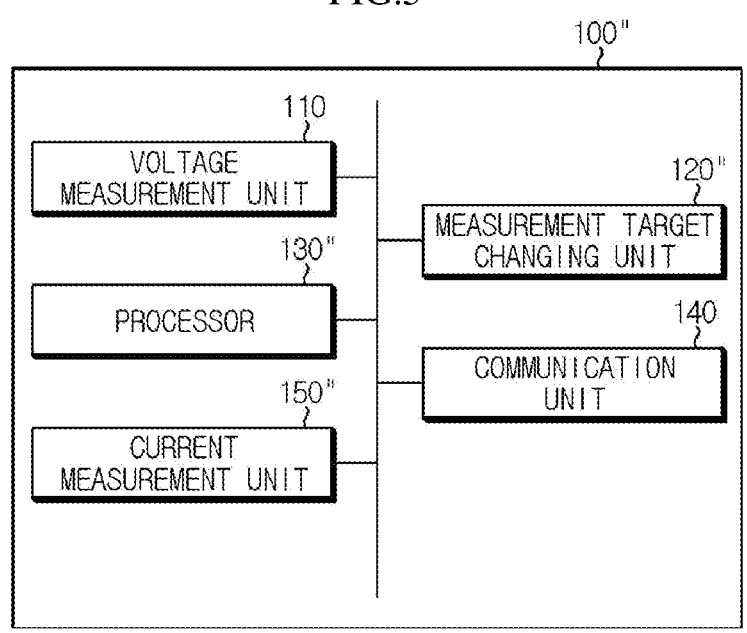
FIG. 5 is a block diagram showing a functional configuration of a battery management apparatus according to still another embodiment of the present disclosure.
Figure 6:
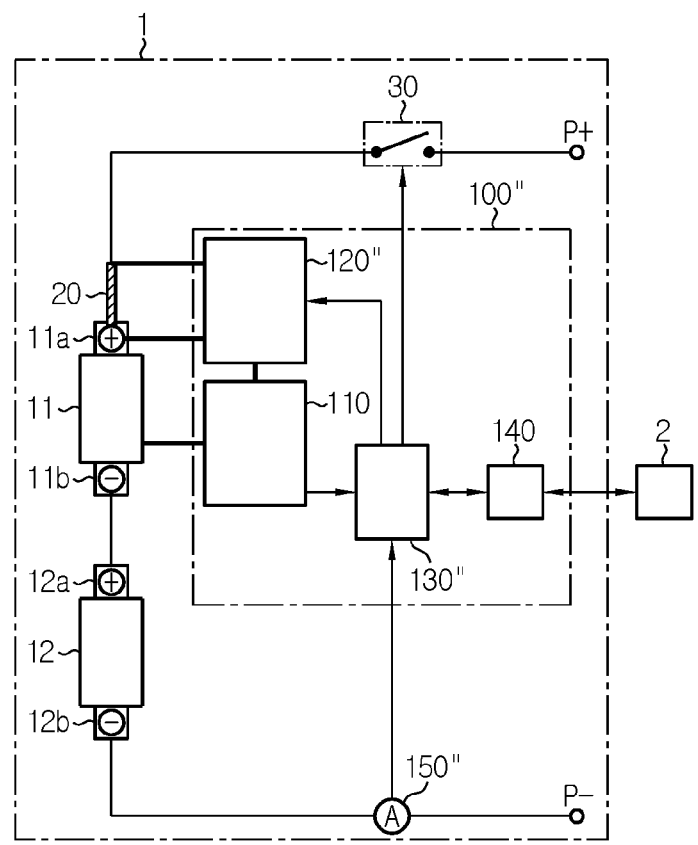
FIG. 6 is a circuit diagram showing a functional configuration of a battery pack including the battery management apparatus according to still another embodiment of the present disclosure.
Figure 7:
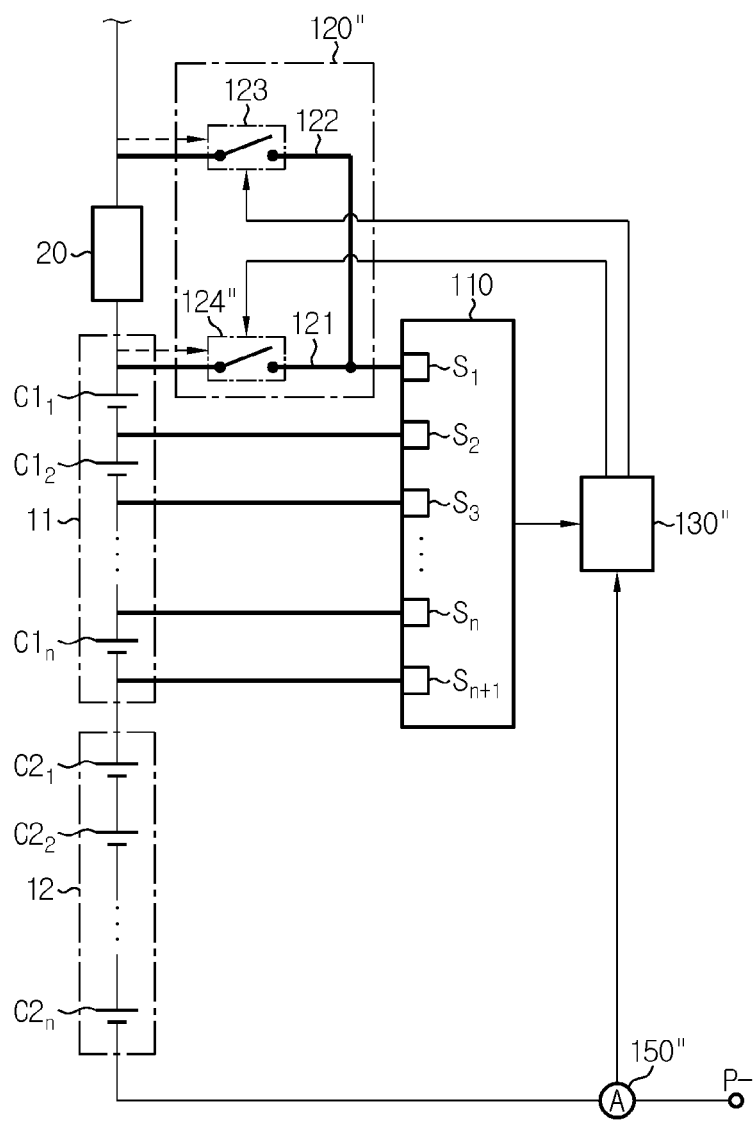
FIG. 7 is a circuit diagram showing a current path according to operation states of a first switching element and a second switching element.

FIG. 5 is a block diagram showing a functional configuration of a battery management apparatus 100" according to still another embodiment of the present disclosure, FIG. 6 is a circuit diagram showing a functional configuration of a battery pack 1 including the battery management apparatus 100" according to still another embodiment of the present disclosure, and FIG. 7 is a circuit diagram showing a current path according to operation states of a first switching element 123 and a second switching element 124".

Referring to FIGS. 5 to 7, a battery management apparatus 100" according to still another embodiment of the present disclosure is different from the battery management apparatus 100 according to an embodiment of the present disclosure in the point that the configuration of the measurement target changing unit 120" and the role of the processor 130" are partially different and a current measurement unit 150" is further included. Except for them, the components included in the battery management apparatus 100" according to still another embodiment of the present disclosure and their roles may be identical to those of the battery management apparatus 100 according to an embodiment of the present disclosure. Thus, repeated explanations will be omitted.

The measurement target changing unit 120" of the battery management apparatus 100" according to still another embodiment of the present disclosure includes a first measurement line 121, a second measurement line 122, a first switching element 123 and a second switching element 124".

The second switching element 124" electrically connects or disconnects the first measurement line 121. Specifically, the second switching element 124" is installed to the first measurement line 121. The operation state of the second switching element 124" is controlled into a turn-on state or a turn-off state according to a switching signal from the processor 130".

At this time, while the second switching element 124" is in a turn-off state and the first switching element 123 is in a turn-on state, a current does not flow through the first measurement line 121 but a current flows through the second measurement line 122, so that a voltage applied to the other end of the bus bar 20 is applied to the first measurement channel $S_1$.

In addition, while the second switching element 124" is in a turn-on state and the first switching element 123 is in a turn-off state, a current is interrupted to the second measurement line 122 and a current flows through the first measurement line 121, so that the voltage of the positive electrode terminal of the first battery cell $C1_1$ is applied to the first measurement channel $S_1$.

Also, while the second switching element 124" and the first switching element 123 are in a turn-off state, a current is interrupted to the first measurement line 121 and the second measurement line 122, so that a voltage is not applied to the first measurement channel $S_1$.

The processor 130" according to still another embodiment may calculate the bus bar voltage of the bus bar 20 in the same way as the processor 130 according to an embodiment and the processor 130' according to another embodiment.

However, the processor 130" according to still another embodiment further controls the second switching element 124" in addition to the first switching element 123, and thus the bus bar voltage of the bus bar 20 may be calculated using at least one of the voltages applied to the plurality of plurality of measurement channels $S_1, \ldots, S_{n+1}$ of the voltage measurement unit 110.

The current measurement unit 150" measures a pack current flowing through the high current path of the battery pack 1. For example, as shown in the figures, the current measurement unit 150" may be installed between the negative electrode terminal 12b of the second battery module 12 and the second input and output terminal P−. Here, the current measurement unit 150" may also be installed between the positive electrode terminal 11a of the first battery module 11 and the first input and output terminal P+. The current measurement unit 150" outputs a current signal indicating the measured pack current to the processor 130".

The processor 130" according to still another embodiment diagnoses whether a failure occurs at the bus bar 20, based on the calculated bus bar voltage and the measured pack current.

Specifically, the processor 130" according to still another embodiment calculates a bus bar resistance of the bus bar 20 by using the calculated bus bar voltage and the measured pack current, and diagnoses whether a failure occurs at the bus bar 20 by comparing the calculated bus bar resistance with a reference resistance.

At this time, the processor 130" according to still another embodiment calculates the bus bar resistance by using Equation 1 below.

$$R_b = V_b / I_p$$ <Equation 1>

Here, $R_b$ is a bus bar resistance, $V_b$ is a bus bar voltage, and $I_p$ is a pack current.

The processor 130" according to still another embodiment diagnoses that a failure occurs at the bus bar 20 if the calculated bus bar resistance is greater than the reference resistance. On the contrary, the processor 130" according to still another embodiment diagnoses that a failure does not occur at the bus bar 20 if the calculated bus bar resistance is smaller than the reference resistance.

Here, the failure may mean a state where a crack is generated at the bus bar 20 or the bus bar 20 is separated from a pack case of the battery pack 1 without being closely attached thereto.

The processor 130" according to still another embodiment controls the operation state of at least one of the first switching element 123 and the second switching element 124" based on the diagnosing result on whether a failure occurs at the bus bar 20.

Specifically, if it is diagnosed that a failure occurs at the bus bar 20, the processor 130" according to still another embodiment controls the operation states of the first switching element 123 and the second switching element 124" into a turn-off state. Accordingly, as shown in FIG. 7, the bus bar voltage may not be applied to the first measurement channel S of the voltage measurement unit 110.

On the contrary, if it is diagnosed that a failure does not occur at the bus bar 20, the processor 130" according to still another embodiment does not control the operation states of both of the first switching element 123 and the second switching element 124" into a turn-off state.

According to the present disclosure, if a failure does not occur at the bus bar 20, the operation states of the first switching element 123 and the second switching element 124" are controlled into a turn-off state, thereby preventing a phenomenon that a high voltage applied to the bus bar 20 is applied to the first measurement channel $S_1$ of the voltage measurement unit 110 as a failure occurs to increase the resistance.

The communication unit 140 may transmit a diagnosis message indicating the diagnosing result from the processor 130" to the external device 2.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
11: first battery module
12: second battery module
20: bus bar
30: contactor
100, 100": battery management apparatus
110: voltage measurement unit
120, 120": measurement target changing unit
130, 130', 130": processor
140: communication unit
150": current measurement unit

What is claimed is:

1. A battery management apparatus, which monitors a state of a bus bar electrically connected to an input and output terminal of a battery pack including at least one battery module, the battery management apparatus comprising:
a voltage measurement unit having a plurality of measurement channels respectively electrically connected to corresponding electrode terminals of a plurality of battery cells included in the battery module and configured to measure respective voltages applied to the plurality of measurement channels;
a measurement target changing unit having a first measurement line for electrically connecting a positive electrode terminal of a first battery cell among the plurality of battery cells to a first measurement channel among the plurality of measurement channels, a second measurement line, and a first switching element positioned on the second measurement line and having a closed state in which the second measurement line electrically connects the bus bar to the first measurement channel and an open state in which the bus bar and the first measurement channel are electrically disconnected; and
a processor configured to:
control an operation state of the first switching element between the closed state and the open state; and
calculate a bus bar voltage applied to the bus bar based on a first voltage applied to the first measurement channel and a cell voltage of a battery cell other than the first battery cell applied to a measurement channel other than the first measurement channel.

2. The battery management apparatus according to claim 1,
wherein the processor is configured to calculate the bus bar voltage while the first switching element is in the closed state.

3. The battery management apparatus according to claim 2,
wherein, while the first switching element is in the closed state, the processor is configured to:
calculate a first voltage difference between the first voltage and a third voltage applied to a second measurement channel that is electrically connected to a negative electrode terminal of the first battery cell; and
calculate the bus bar voltage based on the first voltage difference and the cell voltage of the battery cell other than the first battery cell.

4. The battery management apparatus according to claim 2,
wherein the processor is configured to calculate a second bus bar voltage based on a second voltage difference between the first voltage and a third voltage applied to the first measurement channel while the first switching element is in the open state.

5. The battery management apparatus according to claim 1,
wherein the processor is configured to control the operation state of the first switching element to the open state in response to receipt of a cell voltage measurement request signal requesting to measure a cell voltage of each of the plurality of battery cells.

6. The battery management apparatus according to claim 5,
wherein while the first switching element is in the open state, the processor is configured to calculate a cell voltage of the first battery cell from a first voltage difference between the first voltage applied and a third voltage applied to a second measurement channel that is electrically connected to a negative electrode terminal of the first battery cell.

7. The battery management apparatus according to claim 1, further comprising:
a current measurement unit configured to measure a pack current flowing at the input and output terminal of the battery pack,
wherein the measurement target changing unit includes a second switching element positioned on the first measurement line and configured to electrically connect and disconnect the positive electrode terminal of the first battery cell and the first measurement channel, and
wherein the processor is configured to:
diagnose whether a failure occurs at the bus bar based on the pack current and the bus bar voltage; and
control an operation state of at least one of the first switching element or the second switching element based on the diagnosing result.

8. The battery management apparatus according to claim 7,
wherein when it is diagnosed that a failure occurs at the bus bar, the processor is configured to control the first switching element to be in the open state, and the second switching element to disconnect the positive electrode terminal of the first battery cell from the first measurement channel.

9. A battery pack, comprising the battery management apparatus according to claim 1.

10. A vehicle, comprising the battery management apparatus according to claim 1.

* * * * *